(12) United States Patent
Legatti

(10) Patent No.: US 11,381,070 B1
(45) Date of Patent: *Jul. 5, 2022

(54) LCDI POWER CORD CIRCUIT

(71) Applicant: Tower Manufacturing Corporation, Providence, RI (US)

(72) Inventor: Raymond H. Legatti, Belleair, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/365,472

(22) Filed: Jul. 1, 2021

(51) Int. Cl.
*H02H 3/00* (2006.01)
*H02H 3/16* (2006.01)
*G01R 31/52* (2020.01)
*H02H 1/00* (2006.01)

(52) U.S. Cl.
CPC ............... *H02H 3/16* (2013.01); *G01R 31/52* (2020.01); *H02H 1/0007* (2013.01)

(58) Field of Classification Search
None
See application file for complete search history.

(56) References Cited

U.S. PATENT DOCUMENTS

| | | | |
|---|---|---|---|
| 4,918,977 A | 4/1990 | Takahaski et al. | |
| 5,517,165 A | 5/1996 | Cook | |
| 6,144,209 A | 12/2000 | Raymond et al. | |
| 6,218,647 B1 | 4/2001 | Jones | |
| 7,307,211 B1 | 12/2007 | Caccia | |
| 7,492,558 B2 | 2/2009 | Germain et al. | |
| 8,384,502 B2 | 2/2013 | Gao | |
| 8,587,914 B2 | 11/2013 | Kamor et al. | |
| 8,659,857 B2 | 2/2014 | Gandolfi | |
| 8,760,824 B2 | 6/2014 | Armstrong | |
| 9,312,680 B2 | 4/2016 | Li et al. | |
| 9,450,395 B2 | 9/2016 | Aromin et al. | |
| 9,478,382 B1 | 10/2016 | Aromin | |
| 9,608,433 B2 | 3/2017 | Simonin | |
| 9,966,165 B2 | 5/2018 | Gross et al. | |
| 10,001,526 B2 | 6/2018 | Salas | |
| 10,020,649 B2 | 7/2018 | Du | |
| 10,984,923 B2 * | 4/2021 | Aromin | H01B 7/228 |
| 11,037,700 B2 * | 6/2021 | Aromin | H01B 1/026 |
| 11,037,707 B2 * | 6/2021 | Aromin | H01B 9/003 |
| 2005/0243485 A1 | 11/2005 | Gershen et al. | |
| 2011/0209894 A1 | 9/2011 | Williams et al. | |
| 2018/0017611 A1 | 1/2018 | Radun et al. | |
| 2018/0337530 A1 | 11/2018 | Gariboldi et al. | |

* cited by examiner

*Primary Examiner* — Stephen W Jackson

(57) ABSTRACT

A LCDI power cord circuit is provided. The includes energizing shielded wires and monitoring the energized shields for surges, e.g., arcing, and/or voltage drops, e.g., shield breaks detected by a Power Cord Fault Circuit (PCFC). The PCFC includes one dual purpose amplifying/switch transistor and the LCDI power cord circuit does not include any discrete capacitive components.

16 Claims, 7 Drawing Sheets

LCDI POWER CORD CIRCUIT

BACKGROUND

1. Field of Use

This invention relates to leakage current detection and interruption (LCDI) power cord circuits for detecting a leakage current and open or faulty shields in a power cord.

2. Description of Prior Art (Background)

With the wide use of household electrical appliances, such as air conditioners, washing machines, refrigerators, etc., more attention is being paid to the safety of using such appliances. An appliance typically has a power cord of one meter or longer.

Power cords may age due to long-term use, or become damaged when the appliance is moved, which may cause a current leakage between the phase line and the neutral or ground lines in the cord. Such leakage current may cause sparks, which may cause fire and property damages. To quickly and accurately detect leakage current in the power cord, an additional conductor is often provided and electrically connected to a metal sheath surrounding the phase line and the neutral line. Leakage current can be detected by detecting a voltage on the metal sheath. The metal sheaths are conventionally made by weaving thin copper wires.

Further, the metal sheath can fail due to failure in structural integrity or corrosion. Failure of the metal sheath to provide continuity between the power cord source and the power cord load may allow leakage current to not be detected by an LCDI circuit.

Prior art solutions often provide a circuit for detecting an open metal, i.e., failed structural integrity and a separate circuit for detecting leakage current. Multiple circuits require more components, increased footprint, and longer production cycles. Therefore, a need exists for a single circuit for detecting leakage current, metal sheath structural integrity, and metal sheath corrosion that could interfere with leakage current detection.

BRIEF SUMMARY

Accordingly, the present invention provides a power cord circuit useful for appliances such as air conditioners, washing machines, refrigerators, etc.

In accordance with one embodiment of the present invention a Leakage Current Detection Interrupter (LCDI) circuit for interrupting AC power from an AC source connected to a load via an insulated neutral wire surrounded by a neutral wire shield (NWS) and an insulated line wire surrounded by a line wire shield (LWS) is provided. The LCDI circuit includes a power supply circuit for supplying a rectified voltage waveform and a floating load connected to the power supply circuit. The floating load includes a power cord fault circuit (PCFC) for monitoring the NWS and LWS integrity and leakage current. The LCDI does not include any discrete capacitors as in other prior art solutions, thereby reducing cost, footprint, and production times.

The invention is also directed towards an A Leakage Current Detection Interrupter (LCDI) circuit for interrupting AC power from an AC source connected to a load via an insulated neutral wire and an insulated line wire, wherein the insulated neutral wire and an insulated line wire are surrounded by a conductive shield (CS). The LCDI circuit includes a power supply circuit for supplying a rectified voltage waveform and a floating load connected to the power supply circuit. The floating load includes a power cord fault circuit (PCFC) for monitoring the CS integrity and detecting leakage current. The PCFC includes a solid-state amplifier (SSA) connectable to the CS; a bi-stable latching device having on/off states. The SSA connected to the bi-stable latching device being selectively turned on and off based upon sufficient application of a portion of the rectified signal positive pulse to a base of the SSA. The LCDI does not include any discrete capacitors as in other prior art solutions, thereby reducing cost, footprint, and production times.

In accordance with another embodiment of the present invention a power cord circuit comprising a floating load is presented. The floating load includes a power cord fault circuit (PCFC) for monitoring power cord integrity and detecting leakage current. The PCFC includes a solid-state amplifier (SSA) connectable to a conductive shield (CS). The bi-stable latching device having on/off states and wherein the SSA connected to the bi-stable latching device being selectively turned on or off based upon application of a portion of a rectified signal positive pulse to a base of the SSA. The PCFC does not include any discrete capacitors as in other prior art solutions, thereby reducing cost, footprint, and production times.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example; and If the specification states a component or feature "may," "can," "could," "should," "preferably," "possibly," "typically," "optionally," "for example," or "might" (or other such language) be included or have a characteristic, that particular component or feature is not required to be included or to have the characteristic.

Figure 1:
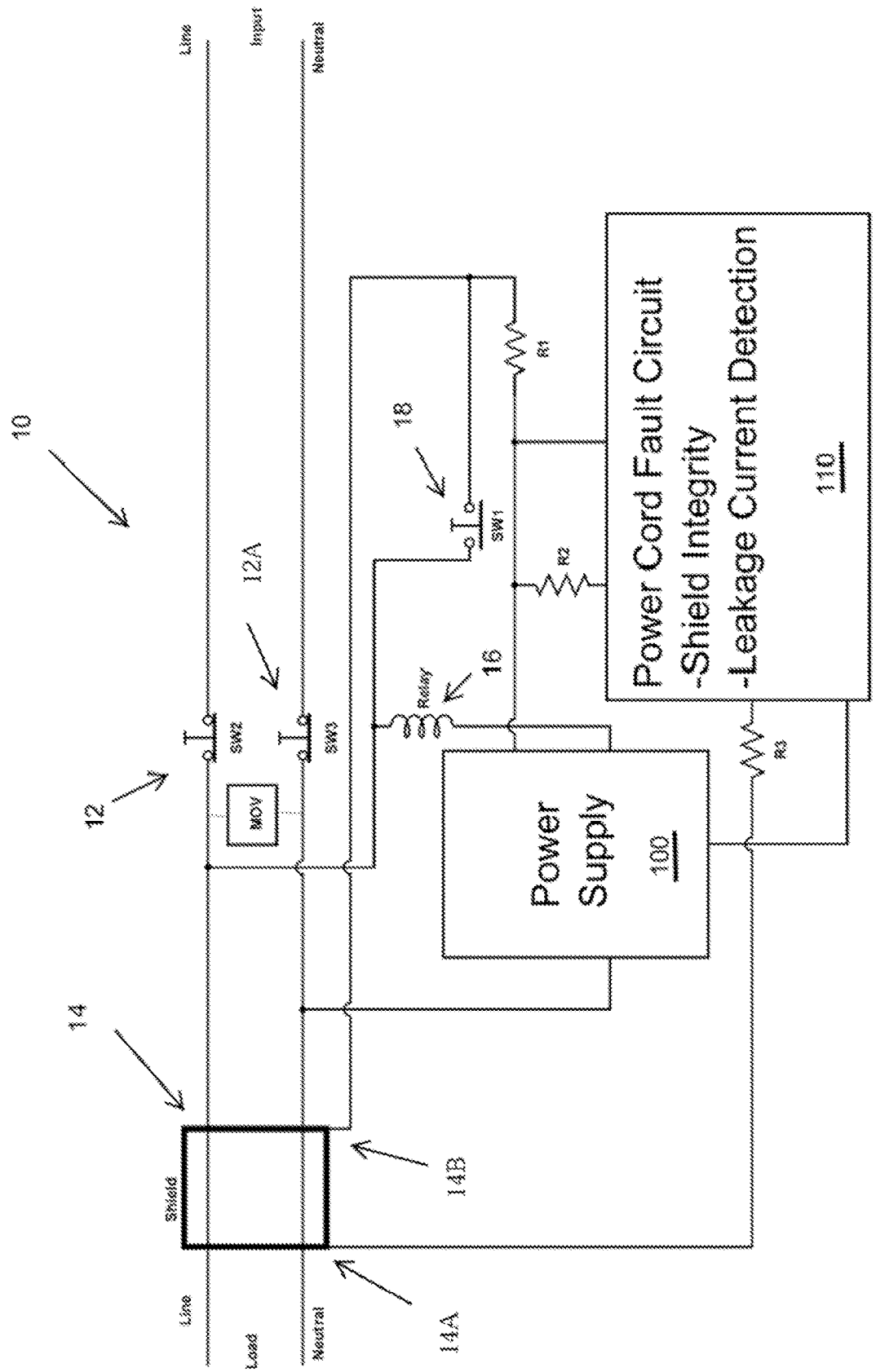
FIG. 1 is a circuit block diagram of the LCDI Power Cord Circuit in accordance with the present invention.

Referring to FIG. 1 there is shown a circuit block diagram of a LCDI POWER CORD CIRCUIT 10 (LCDI). LCDI circuit 10 includes shield 14, switch 18, power supply circuit 100, power cord fault circuit (PCFC) 110, relay 16; and, mechanically latched double pole switches 12, 12A, hereinafter referred to as the manual reset switch or mechanically latched double pole switch. As shown herein the PCFC comprises a floating load with respect to the power supply 100.

As is described in more detail herein, when manual reset switches 12, 12A are set line voltage is connected to LOAD and to power supply circuit 10 via relay 16. Power supply circuit 100 supplies bias voltages to PCFC 110, and shield. Shield 14, having a load end, 14A and a line end 14B, is connected in series between power supply 100 and PCFC 110. As is discussed and shown in more detail herein, the PCFC 110 allows a small amount of relay current to flow through relay 16 but less than the energizing current needed to energize relay 16 to disengage manual reset switches 12A,12B. It is appreciated that not starting from zero energizing current allows solenoid 519 to energize faster when a fault is detected.

Figure 1A:
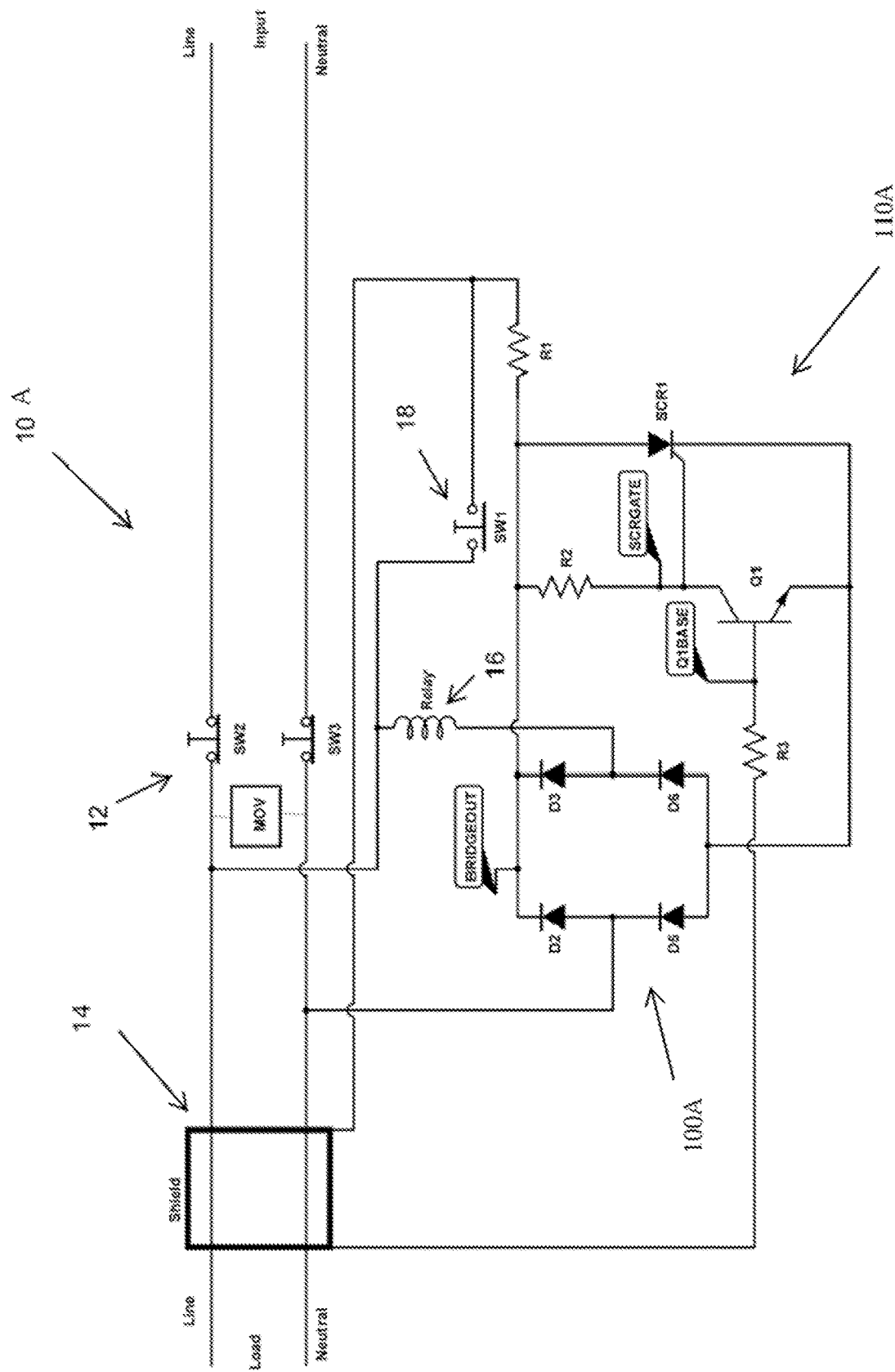
FIG. 1A is a detailed schematic diagram of the block diagram shown in FIG. 1.

Referring also to FIG. 1A there is shown a detailed circuit 10A of the block diagram 10 shown in FIG. 1. LCDI circuit 10A includes shield 14A, switch 18, power supply circuit 100A, and PCFC 110A. PCFC 110A includes solid state amplifying transistor Q1 and bi-stable latching device silicon-controlled rectifier SCR1. Transistor Q1 may be operated in a full conduction state, e.g., as a switch, or in a partial conduction state, e.g., as an amplifier, when a fault is detected. Shield 14 may be any suitable conductive shield surrounding the line and neutral wires. As is described in more detail herein, when manual reset switches 12, 12A are set line voltage is connected to LOAD and to power supply circuit 100A via relay 16. Power supply circuit 100A supplies bias voltages to PCFC 110A, and shield 14. As is discussed and shown in more detail herein, the PCFC 110A allows a small amount of relay current to flow through relay 16 but less than the energizing current needed to energize relay 16 to disengage manual reset switches 12, 12A. It is appreciated that not starting from zero energizing current allows relay 519 to energize faster when a fault is detected.

Figure 3:
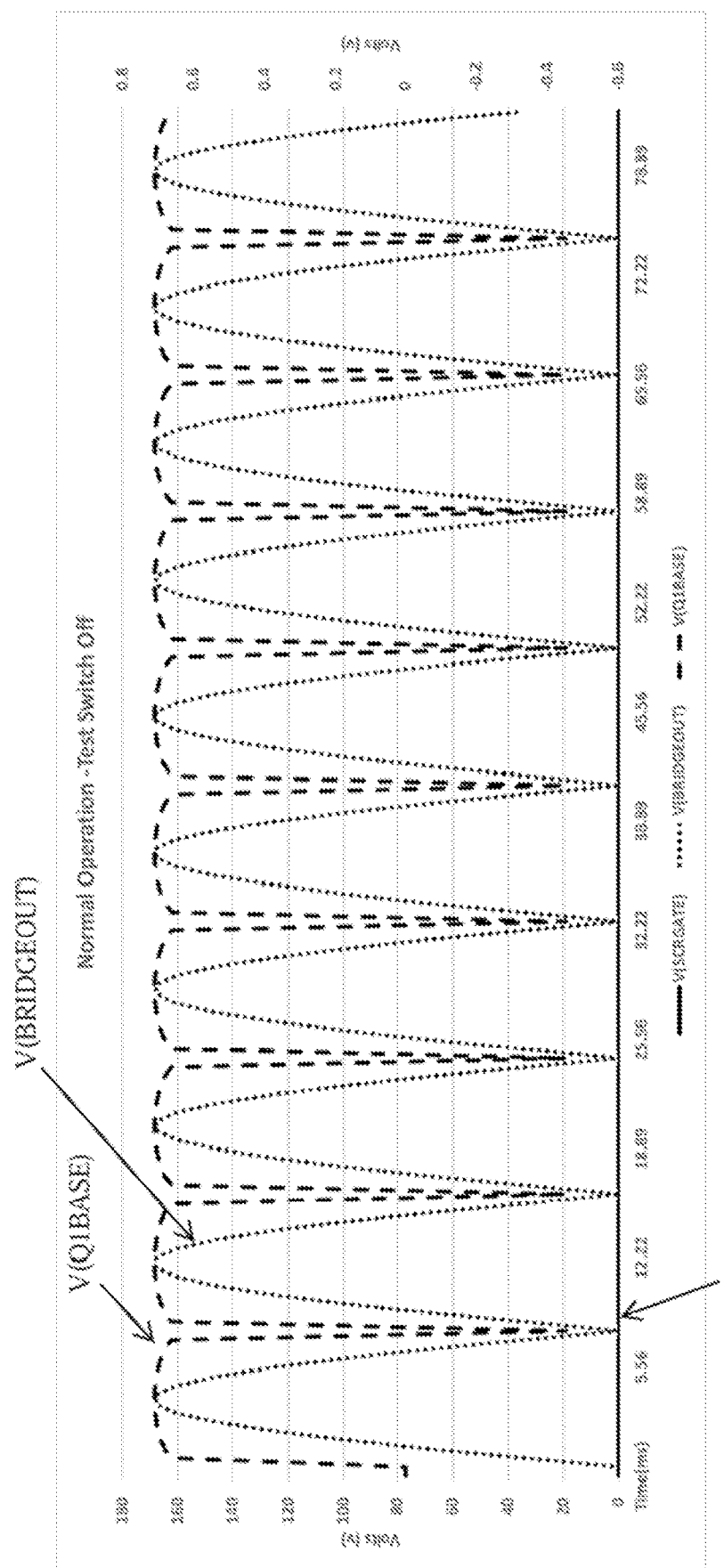
FIG. 3 is a waveform diagram for the normal operating condition of the Power Cord Circuit shown in FIG. 1, 1A, 2, or 2A.

Referring now to FIG. 1A and FIG. 3. When switches 12, 12A are mechanically (manually) engaged AC line voltage is connect to LOAD. 60 Hz AC line voltage is also connected to power supply circuit 110A via relay 16. Power supply circuit 110A, comprising bridge rectifier (diodes D1-D4) outputs a rectified unsmoothed DC signal at BRIDGEOUT. The rectified unsmoothed DC signal at BRIDGEOUT is routed through R1 to Q1 base via shield 14. The rectified unsmoothed DC signal at BRIDGEOUT is also routed through R2 to Q1 collector and SCR1 gate.

Still referring to FIG. 1A and FIG. 3, the rectified unsmoothed DC signal at BRIDGEOUT is routed to the base of npn transistor Q1, R1 and R3 biasing Q1 into an on condition during the positive cycle of the rectified unsmoothed DC, dropping the rectified voltage across R2. When Q1(B) voltage drops below $V_{BE}$ Q1 turns off and the voltage at Q1(C) is near 0 v due to the unsmoothed DC signal at BRIDGEOUT dropping to near 0 v in the cycle. When the unsmoothed DC signal at BRIDGEOUT swings positive, Q1 is again biased on, dropping the unsmoothed DC signal at BRIDGEOUT across R2, keeping SCR1 in an off condition during normal operation. It will be further appreciated that during normal operation as the transistor Q1 is forward biased, the gate of SCR1 is essentially tied to the SCR1 cathode and that this action minimizes nuisance tripping.

Still referring to FIG. 1A, it is understood that under normal conditions the rectified unsmoothed DC signal at BRIDGEOUT is dropped across resistor R2 and that R2 is sized to allow an amount of AC current less than the relay 16 energizing current to flow through R2 through Q1 back to neutral when Q1 is conducting. During Q1's off state, or non-conducting state, relay 16 inductively opposes the change in current until Q1 again turns on, thus maintaining, or nearly maintaining the current flow through SOL1 519. It is understood and appreciated that the small amount of relay current flowing through relay 16 is less than the energizing current needed to energize relay 16 to disengage manual reset switches 12,12A. It is further appreciated that not starting from zero energizing current allows relay 16 to energize faster when a fault is detected.

Figure 5:
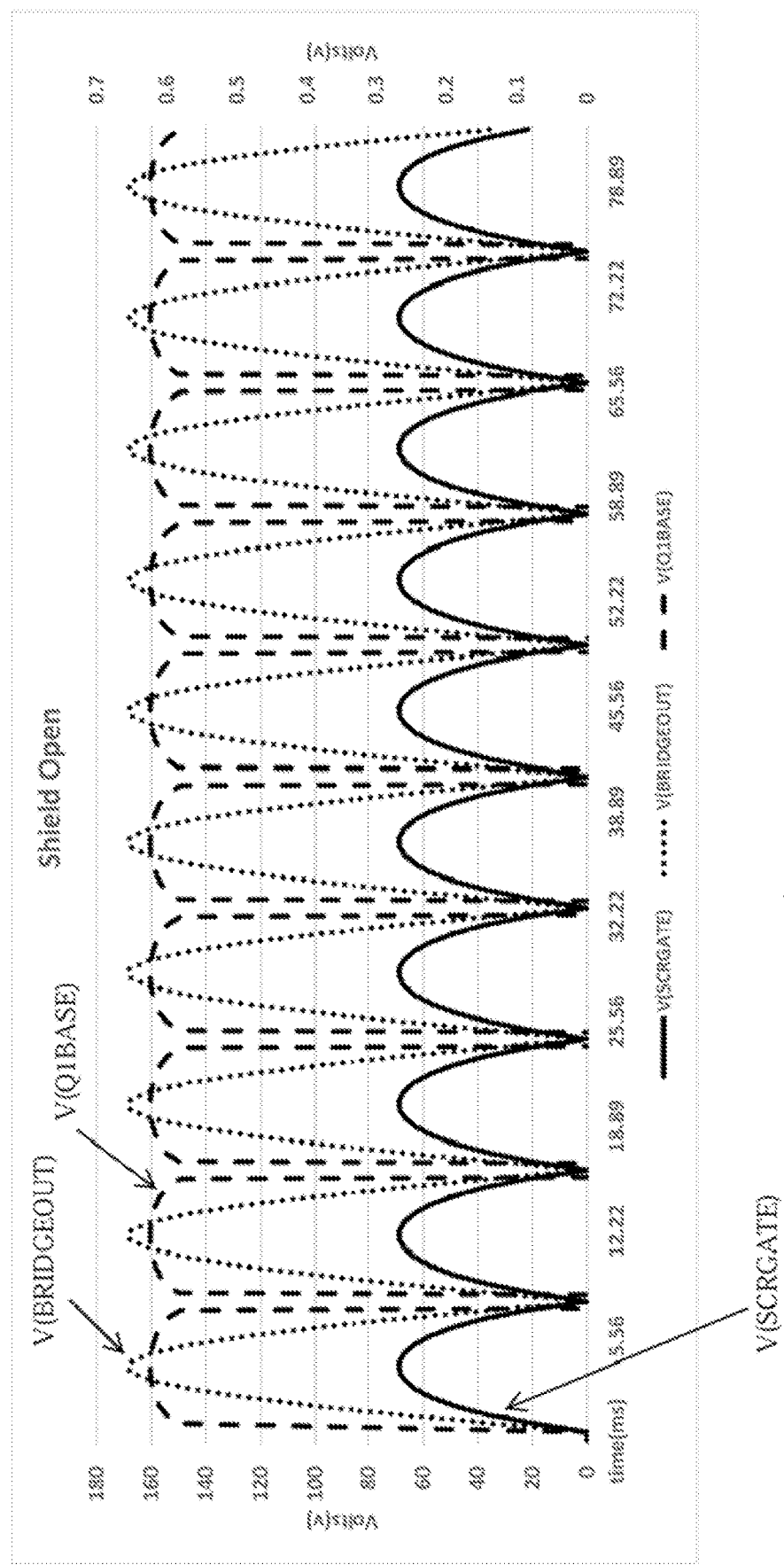
FIG. 5 is a waveform diagram for the shield open or degraded detection condition of the Power Cord Circuit shown in FIG. 1, 1A, 2, or 2A.

Still referring to FIG. 1A and now FIG. 5, when shield 14 integrity is compromised, such as, for example, a break in shield 14, or a voltage drop across areas of corrosion within the power cable, the bias-on voltage $V_{BE}$ at the base of Q1 is insufficient to bias Q1 in its full conductive on-state, thus the voltage on Q1 collector is an amplified voltage of the signal at Q1 base. The voltage at the Q1 collector (V(SCR-GATE)) begins to rise on the first positive rectified input cycle to trigger SCR1 into an on condition, sufficiently increasing current flow through relay 16 to energize relay 16 to disengage manual reset switches 12,12A. Thus, interrupting power from the AC line source to the load. It is understood and appreciated that the full wave bridge rectifier 100A enables the PCFC 110A to detect and disconnect the AC line source from the load when a fault is detected during the positive or negative cycle of an input AC waveform (not shown). In other words, the PCFC 110A detects and interrupts power between the AC line source and load within approximately 1 ms or less for a 60 Hz AC source.

Figure 4:
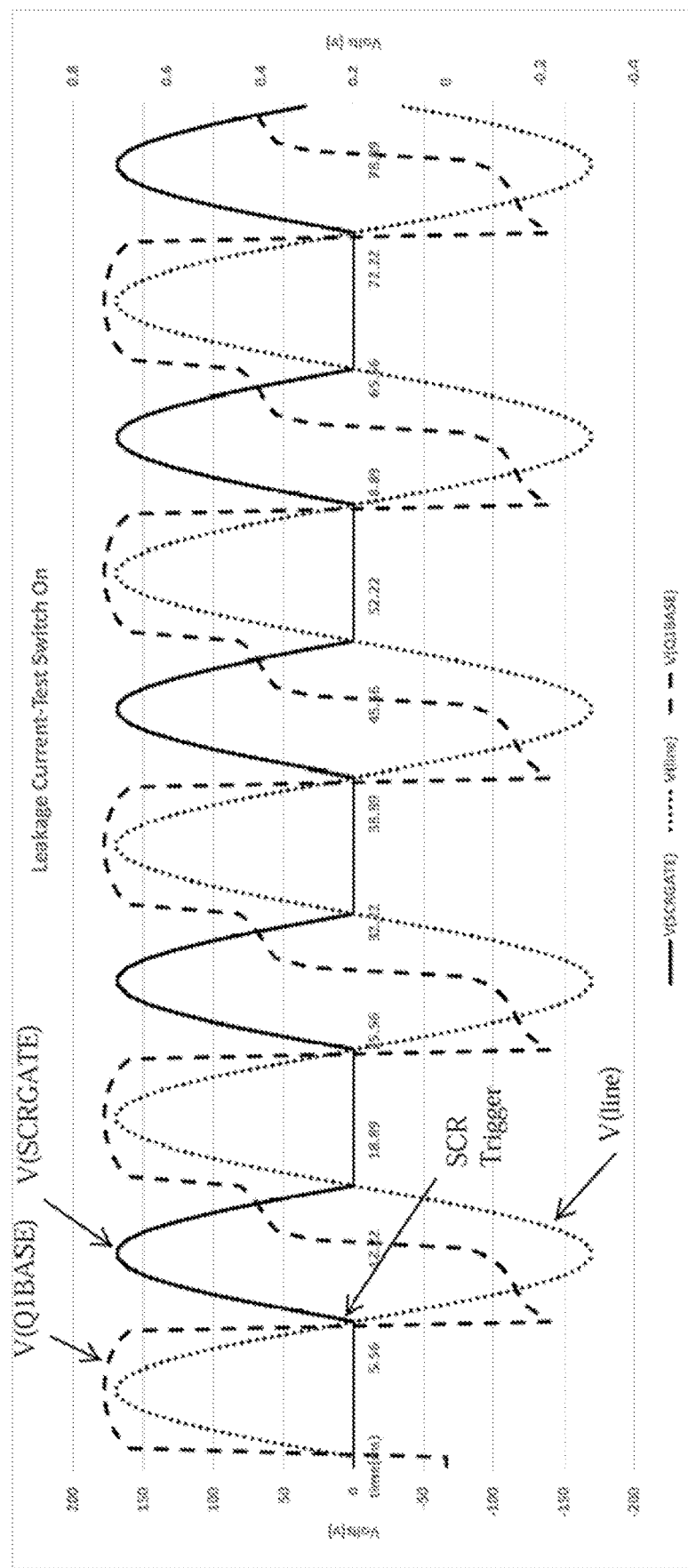
FIG. 4 is a waveform diagram for the leakage current detection condition of the Power Cord Circuit shown in FIG. 1, 1A, 2, or 2A.

Still referring to FIG. 1A and now FIG. 4, when shield 14 integrity is compromised, such as, for example, a leakage current, the bias-on voltage $V_{BE}$ at the base of Q1 is insufficient to keep Q1 in its full conductive state. The voltage at the Q1 collector (V(SCRGATE)) begins to rise on the second positive rectified input cycle to trigger SCR1 into an on condition, sufficiently increasing current flow through relay 16 to energize relay 16 to disengage manual reset switches 12,12A. Thus, interrupting power from the AC line source to the load. It is understood and appreciated that the full wave bridge rectifier 100A enables the PCFC 110A to detect leakage current and disconnect the AC line source from the load when a fault is detected during the negative cycle of an input AC waveform (not shown). In other words, the PCFC 110A detects and interrupts power between the AC line source and load within approximately 17 ms. or less for a 60 Hz AC source.

Figure 2:
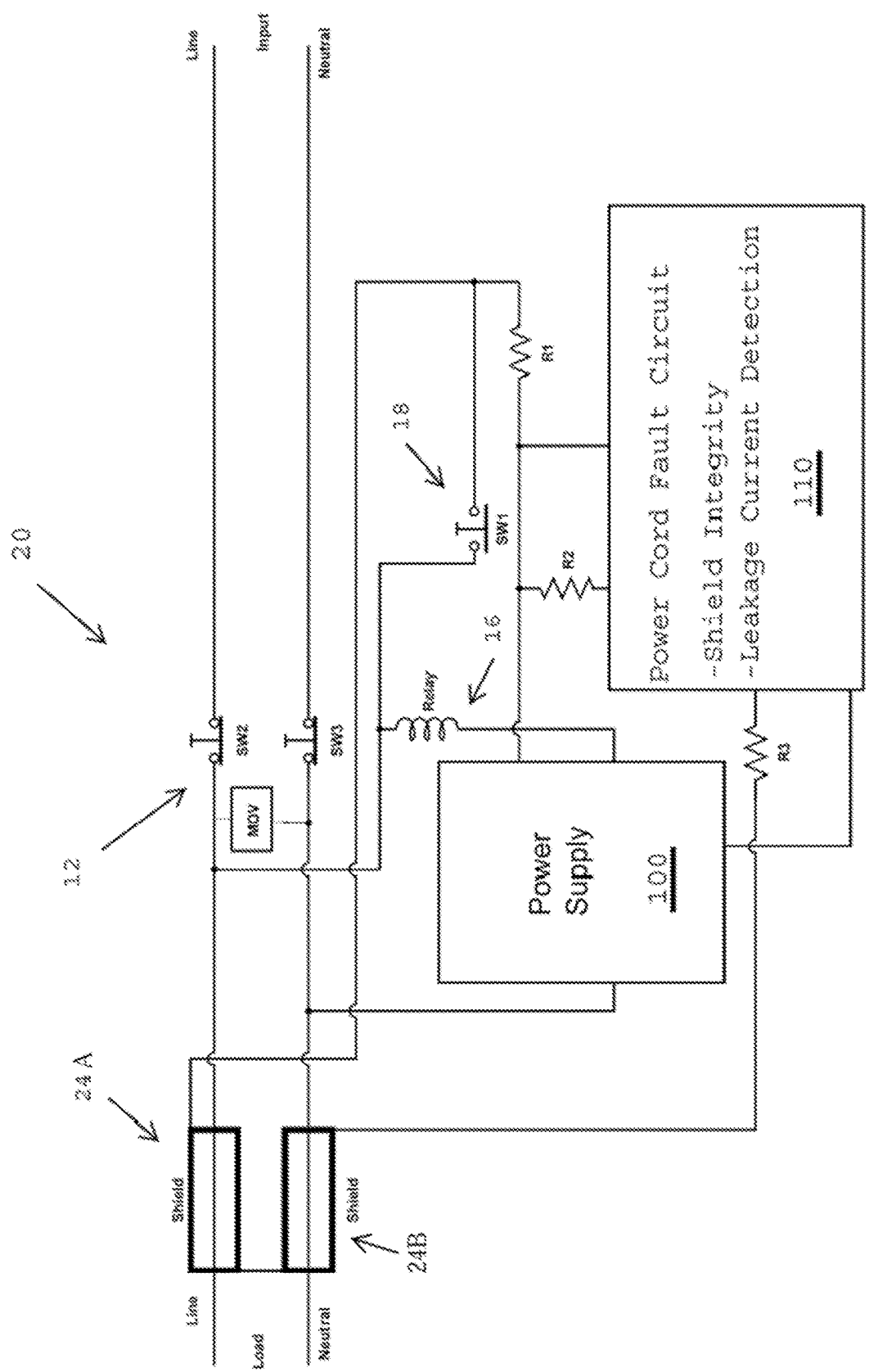
FIG. 2 is an alternate circuit block diagram of the circuit block diagram shown in
FIG. 1.

Referring to FIG. 2 there is shown a circuit block diagram of a LCDI POWER CORD CIRCUIT 10 (LCDI). LCDI circuit 10 includes shields 24A, 24B, switch 18, power supply circuit 100, power cord fault circuit (PCFC) 110, relay 16; and, manually engaged ganged switches 12, 12A, hereinafter referred to as the manual reset switch. As shown herein the PCFC comprises a floating load with respect to the power supply 100.

As is described herein, when manual reset switches 12, 12A are set line voltage is connected to LOAD and to power supply circuit 10 via relay 16. Power supply circuit 100 supplies bias voltages to PCFC 110, and shields 24A and 24B. Shields 24A and 24B are connected in series at the Load end, are connected in series between power supply 100 and PCFC 110. As is discussed and shown in more detail herein, the PCFC 110 allows a small amount of relay current to flow through relay 16 but less than the energizing current needed to energize relay 16 to disengage manual reset switches 12A,12B. It is appreciated that not starting from zero energizing current allows solenoid 519 to energize faster when a fault is detected.

Figure 2A:
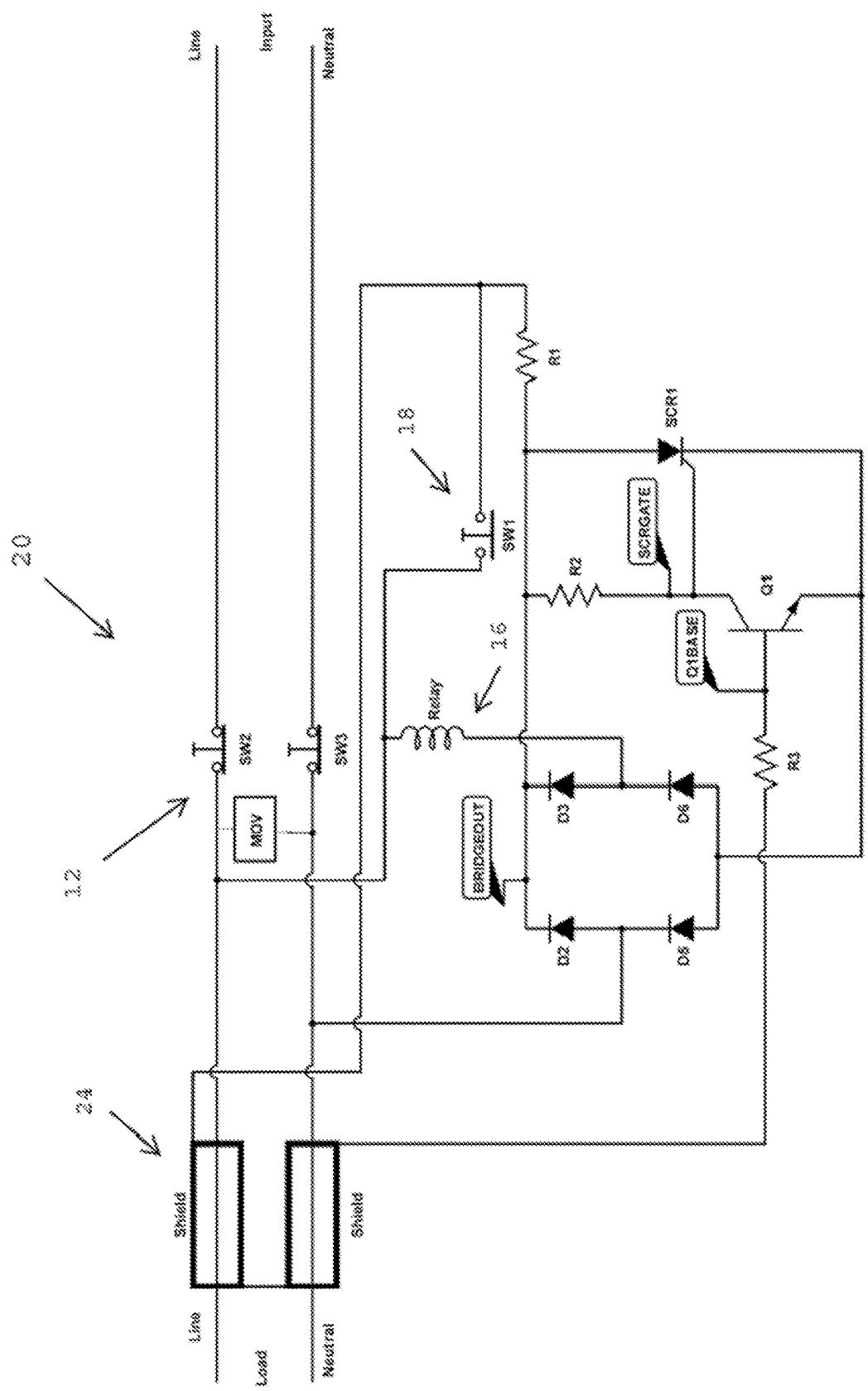
FIG. 2A is a detailed schematic diagram of the block diagram shown in FIG. 5.

Referring also to FIG. 2A there is shown a detailed circuit 10A of the block diagram 10 shown in FIG. 2. LCDI circuit 10A includes shield 14A, switch 18, power supply circuit 100A, and PCFC 110A. Shield 14 may be any suitable conductive shield surrounding the line and neutral wires. As is described in more detail herein, when manual reset switches 12, 12A are set line voltage is connected to LOAD and to power supply circuit 100A via relay 16. Power supply circuit 100A supplies bias voltages to PCFC 110A, and shields 24A and 24B. As is discussed and shown in more detail herein, the PCFC 110 allows a small amount of relay current to flow through relay 16 but less than the energizing current needed to energize relay 16 to disengage manual reset switches 12, 12A. It is appreciated that not starting from zero energizing current allows relay 519 to energize faster when a fault is detected.

Referring now to FIG. 2A and FIG. 3. When switches 12, 12A are mechanically (manually) engaged AC line voltage is connect to LOAD. 60 Hz AC line voltage is also connected to power supply circuit 110A via relay 16. Power supply circuit 110A, comprising bridge rectifier (diodes D1-D4) outputs a rectified unsmoothed DC signal at BRIDGEOUT. The rectified unsmoothed DC signal at BRIDGEOUT is routed through R1 to Q1 base via shields 24A, 24B. The rectified unsmoothed DC signal at BRIDGEOUT is also routed through R2 to Q1 collector and SCR1 gate.

Still referring to FIG. 2A and FIG. 3, the rectified unsmoothed DC signal at BRIDGEOUT is routed to the base of npn transistor Q1, R1 and R3 biasing Q1 into an on condition during the positive cycle of the rectified unsmoothed DC, dropping the rectified voltage across R2. When Q1(B) voltage drops below $V_{BE}$ Q1 turns off and the voltage at Q1(C) is near 0 v due to the unsmoothed DC signal at BRIDGEOUT dropping to near 0 v in the cycle. When the unsmoothed DC signal at BRIDGEOUT swings positive, Q1 is again biased on, dropping the unsmoothed DC signal at BRIDGEOUT across R2, keeping SCR1 in an off condition during normal operation.

Still referring to FIG. 2A, it is understood that under normal conditions the rectified unsmoothed DC signal at BRIDGEOUT is dropped across resistor R2 and that R2 is sized to allow an amount of AC current less than the relay 16 energizing current to flow through R2 through Q1 back to neutral when Q1 is conducting. During Q1's off state, or non-conducting state, relay 16 inductively opposes the change in current until Q1 again turns on, thus maintaining, or nearly maintaining the current flow through SOL1 519. It is understood and appreciated that the small amount of relay current flowing through relay 16 is less than the energizing current needed to energize relay 16 to disengage manual reset switches 12,12A. It is further appreciated that not starting from zero energizing current allows relay 16 to energize faster when a fault is detected.

Still referring to FIG. 2A and now FIG. 5, when either of the shields 24A or 24B integrity is compromised, such as, for example, a break in either shield, or a voltage drop across areas of corrosion within the power cable, the bias-on voltage $V_{BE}$ at the base of Q1 is insufficient to keep Q1 in its full conductive state. The voltage at the Q1 collector (V(SCRGATE)) begins to rise on the first positive rectified input cycle to trigger SCR1 into an on condition, sufficiently increasing current flow through relay 16 to energize relay 16 to disengage manual reset switches 12,12A. Thus, interrupting power from the AC line source to the load. It is understood and appreciated that the full wave bridge rectifier 100A enables the PCFC 110A to detect and disconnect the AC line source from the load when a fault is detected during the positive or negative cycle of an input AC waveform (not shown). In other words, the PCFC 110A detects and interrupts power between the AC line source and load within approximately 1 ms or less for a 60 Hz AC source.

Still referring to FIG. 2A and now FIG. 4, when either of the shields 24A or 24B integrity is compromised, such as, for example, a leakage current, the bias-on voltage $V_{BE}$ at the base of Q1 is insufficient to keep Q1 in its full conductive state. The voltage at the Q1 collector (V(SCRGATE)) begins to rise on the second positive rectified input cycle to trigger SCR1 into an on condition, sufficiently increasing current flow through relay 16 to energize relay 16 to disengage manual reset switches 12,12A. Thus, interrupting power from the AC line source to the load. It is understood and appreciated that the full wave bridge rectifier 100A enables the PCFC 110A to detect leakage current and disconnect the AC line source from the load when a fault is detected during the negative cycle of an input AC waveform (not shown). In other words, the PCFC 110A detects and interrupts power between the AC line source and load within approximately 17 ms. or less for a 60 Hz AC source.

It should be understood that the foregoing descriptions are only illustrative of the invention. It will be appreciated that the PCFC accomplishes leakage current detection and open shield detection. It will also be appreciated the PCFC does not include any discrete capacitors; thus, reducing the number of components and associated product production cycles. Thus, various alternatives and modifications can be devised by those skilled in the art without departing from the invention. For example, solid state devices SCR1 or Q1 can be any suitable solid-state device. Accordingly, the present invention is intended to embrace all such alternatives, modifications and variances that fall within the scope of the appended claims.

What is claimed is:

1. A Leakage Current Detection Interrupter (LCDI) circuit for interrupting AC power from an AC source connected to a load via an insulated neutral wire surrounded by a neutral wire shield (NWS) and an insulated line wire surrounded by a line wire shield (LWS), the LCDI circuit comprising:
   a power supply circuit for supplying a rectified voltage waveform;
   a floating load connected to the power supply circuit, wherein the floating load comprises:
      a power cord fault circuit (PCFC) for monitoring the NWS and LWS integrity and leakage current; and
   wherein the LCDI does not include any discrete capacitors.

2. The LCDI circuit as in claim 1 further comprising:
a mechanically latched double pole switch disposed between the AC source and the load; and
a relay for delatching the double pole switch.

3. The LCDI circuit as in claim 2 wherein the PCFC further comprises a solid-state amplifier (SSA) connectable to the NWS.

4. The LCDI circuit as in claim 3 wherein the PCFC comprises:
the SSA connected to a bi-stable latching device having on/off states, the SSA being selectively turned on and off based upon sufficient application of a portion of the rectified signal positive pulse to a base of the SSA.

5. The LCDI circuit as in claim 4 comprises the SSA selectively turned off based upon insufficient application of the portion of the rectified waveform to the base of the SSA.

6. The LCDI circuit as in claim 5 comprises:
the bi-stable latch device latched to the on state when the SSA is selectively turned off during a portion of the rectified waveform; and
the mechanically latched double pole switch unlatched when the bi-stable latch device is latched to the on state.

7. The LCDI circuit as in claim 1 wherein the power supply circuit comprises a full wave bridge rectifier.

8. The LCDI circuit as in claim 3 wherein the SSA comprises a transistor.

9. A Leakage Current Detection Interrupter (LCDI) circuit for interrupting AC power from an AC source connected to a load via an insulated neutral wire and an insulated line wire, wherein the insulated neutral wire and an insulated line wire are surrounded by a conductive shield (CS), the LCDI circuit comprising:
a power supply circuit for supplying a rectified voltage waveform;
a floating load connected to the power supply circuit, wherein the floating load comprises:
a power cord fault circuit (PCFC) for monitoring the CS integrity, wherein the PCFC comprises:
a solid-state amplifier (SSA) connectable to the CS;
a bi-stable latching device having on/off states and wherein the SSA connected to the bi-stable latching device, the SSA being selectively turned on and off based upon sufficient application of a portion of the rectified signal positive pulse to a base of the SSA; and
wherein the LCDI does not include any discrete capacitors.

10. The LCDI circuit as in claim 9 further comprising:
a mechanically latched double pole switch disposed between the AC source and the load; and
a relay for delatching the double pole switch.

11. The LCDI circuit as in claim 9 comprises the SSA selectively turned off based upon insufficient application of the portion of the rectified waveform to the base of the SSA.

12. The LCDI circuit as in claim 9 comprises:
the bi-stable latch device latched to the on state when the SSA is selectively turned off during a portion of the rectified waveform; and
the mechanically latched double pole switch unlatched when the bi-stable latch device is latched to the on state.

13. A power cord circuit comprising a floating load, wherein the floating load comprises:
a power cord fault circuit (PCFC) for monitoring power cord integrity, wherein the PCFC comprises:
a dual-purpose solid-state amplifier/switch (SSA) connectable to a conductive shield (CS);
a bi-stable latching device having on/off states and wherein the SSA connected to the bi-stable latching device, the bi-stable latching device being selectively turned on or off based upon application of a portion of a rectified signal positive pulse to a base of the SSA; and
wherein the LCDI does not include any discrete capacitors.

14. The power cord circuit as in claim 13 comprises the bi-stable latching device selectively turned on based upon insufficient application of the portion of the rectified waveform to the base of the SSA.

15. The power cord circuit as in claim 13 further comprises at least one shielded wire connected to the PCFC.

16. The power cord circuit as in claim 13 wherein the SSA comprises an npn transistor, the bi-stable latching device comprises a silicon controlled rectifier (SCR) having an anode, gate, and cathode, and wherein the gate of the SCR is effectively tied to the SCR cathode during normal operation as the npn transistor is forward biased minimizing nuisance tripping.

* * * * *